(12) United States Patent
Shin et al.

(10) Patent No.: US 9,553,282 B2
(45) Date of Patent: Jan. 24, 2017

(54) ORGANIC LIGHT EMITTING DIODE

(71) Applicant: LG DISPLAY CO., LTD., Seoul (KR)

(72) Inventors: Moon-Young Shin, Paju-si (KR); Jae-Ha Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/711,272

(22) Filed: May 13, 2015

(65) Prior Publication Data
US 2015/0340646 A1 Nov. 26, 2015

(30) Foreign Application Priority Data
May 21, 2014 (KR) ........................ 10-2014-0061126

(51) Int. Cl.
*H01L 51/52* (2006.01)
*H01L 27/32* (2006.01)

(52) U.S. Cl.
CPC ......... *H01L 51/529* (2013.01); *H01L 51/5237* (2013.01); *H01L 27/3211* (2013.01)

(58) Field of Classification Search
CPC . H01L 51/529; H01L 51/5237; H01L 27/3211
See application file for complete search history.

(56) References Cited

U.S. PATENT DOCUMENTS

| 2008/0007159 A1 | 1/2008 | Seo et al. |
| 2013/0170156 A1 | 7/2013 | Jung et al. |
| 2014/0103809 A1* | 4/2014 | Bang ...................... H01L 51/529 315/113 |

* cited by examiner

*Primary Examiner* — Kyoung Lee
(74) *Attorney, Agent, or Firm* — Birch, Stewart, Kolasch & Birch, LLP

(57) ABSTRACT

An organic light emitting diode (OLED) according to an embodiment can include an OLED panel; a printed circuit board adhered onto a rear surface of the OLED panel; and a back cover including first and second metal layers, an inorganic substance layer between the first and second metal layers, and a pocket groove in a horizontal surface on which the OLED panel is placed and corresponding to the printed circuit board, wherein the pocket groove is formed by removing the first metal layer corresponding thereto to expose the inorganic substance layer.

14 Claims, 6 Drawing Sheets

ORGANIC LIGHT EMITTING DIODE

The present application claims the priority benefit of Korean Patent Application No. 10-2014-0061126 filed in Republic of Korea on May 21, 2014, which is hereby incorporated by reference in its entirety for all purposes as if fully set forth herein.

BACKGROUND

Field of the Disclosure

The present invention relates to an organic light emitting diode (OLED), and particularly, an OLED that can improve production efficiency and have lightweight and thin profile.

Discussion of the Related Art

An OLED includes a hole injection electrode, an organic light emission layer and an electron injection electrode, and emits light by an energy produced when an exciton generated by combination of electrode and hole transits from an excited state to a ground state.

According to this principle, the OLED has a self-luminous property, and the OLED can have a decreased in thickness and weight because the OLED does not require a light source. Further, since the OLED has high qualities such as low power consumption, high brightness and high response speed, the OLED is considered as a next generation display device.

Generally, the OLED includes an OLED panel having an organic light emitting layer, a cabinet surrounding edge portions of the OLED panel, a back cover disposed on the rear of the OLED panel and accommodating the OLED panel therein, and a cover window disposed on the front of the OLED panel and protecting the OLED panel.

A printed circuit board is connected to the OLED panel at an edge portion of the OLED panel via a connection member, and the printed circuit board is bent toward and adhered onto the rear surface of the back cover.

FIG. 1 is a schematic perspective view illustrating a portion of a rear surface of an OLED according to the related art, and FIGS. 2A and 2B are schematic perspective views illustrating a rear surface of the OLED, on which a system board is mounted, according to the related art.

Referring to FIG. 1, a printed circuit board 18 connected to an edge portion of an OLED 10 via a connecting member 16 is adhered onto a rear surface of a back cover 20 and fixed.

A plurality of driving circuit elements are mounted on the printed circuit board 18, and the printed circuit board 18 is covered by a cover shield 23. The cover shield 23 covers and protects the printed circuit board 18 from an external impact.

The cover shield 23 is assembled and coupled with the printed circuit board 18 using a screw fastening.

Since the printed circuit board 18 is adhered onto the rear surface of the back cover 20, the OLED 10 needs the cover shield 18 to protect the printed circuit board 18, and additional component, such as screws, to assemble and couple the cover shield 23 to the printed circuit board 18.

Accordingly, the additional component causes increased production cost, and production time increases by the assembling, and thus production efficiency decreases remarkably in the related art OLEDs.

Further, referring to FIG. 2A, since the rear surface of the OLED 10 has a complicated shape, an available area of the rear surface of the OLED 10 is small, and particularly, other components can not be mounted at the edge portion A where the printed circuit board 18 is adhered.

Accordingly, a position and an area of a system board 70 mounted on the rear surface of the OLED 10 are limited. Referring to FIG. 2B, the OLED 10, which is coupled with a set frame 60 and completed as a final product, also has a rear surface in a complicated shape, and thus the OLED lacks space applicability, interior decoration and design as required recently.

Further, since the thickness and weight of the related art OLED are increased due to the cover shield 23, there is a limit in providing an OLED having lightweight and thin profile.

SUMMARY

Accordingly, the present invention is directed to an OLED that can have lightweight and thin profile, improve production efficiency, and increase an available area of a rear surface of the OLED.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims as well as the appended drawings.

To achieve these and other advantages, and in accordance with the purpose of the present invention, as embodied and broadly described herein, an organic light emitting diode (OLED) according to an embodiment can include an OLED panel; a printed circuit board adhered onto a rear surface of the OLED panel; and a back cover including first and second metal layers, an inorganic substance layer between the first and second metal layers, and a pocket groove in a horizontal surface on which the OLED panel is placed and corresponding to the printed circuit board, wherein the pocket groove is formed by removing the first metal layer corresponding thereto to expose the inorganic substance layer.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE PREFERRED EMBODIMENTS

Reference will now be made in detail to exemplary embodiments, examples of which are illustrated in the accompanying drawings.

Figure 3:
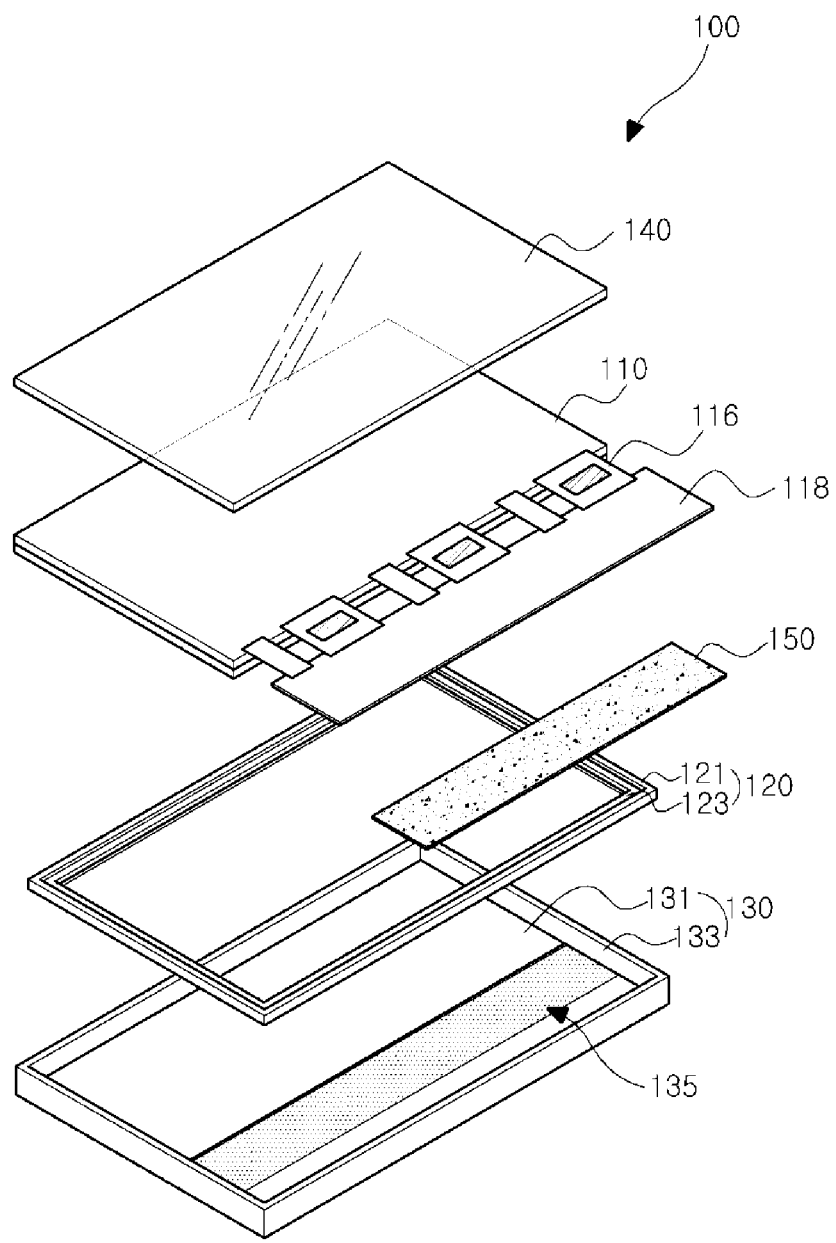
FIG. 3 is a schematic perspective view illustrating an OLED according to an embodiment of the present invention.
Figure 4:
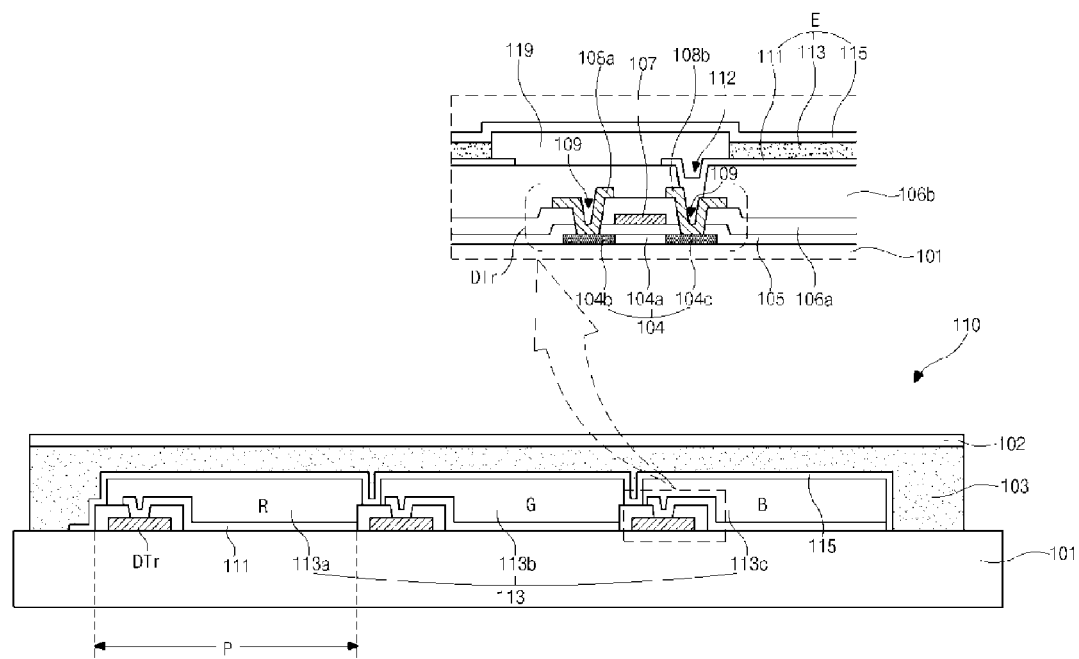
FIG. 4 is a schematic cross-sectional view of the OLED of FIG. 3.

FIG. 3 is a schematic perspective view illustrating an OLED according to an embodiment of the present invention, and FIG. 4 is a schematic cross-sectional view of the OLED of FIG. 3.

Referring to FIGS. 3 and 4, an OLED 100 includes an OLED panel 110 to display images, a cabinet 120 surrounding edge portions of the OLED panel 110, a back cover 130 accommodating the OLED panel 110 therein, and a cover window 140 protecting the OLED panel 110. All the components of the OLED in this and other embodiments are operatively coupled and configured.

For the purpose of explanations, regarding directions of the components in the drawings, when it is assumed that a display surface of the OLED panel 110 heads for front, the back cover 130 is disposed on the rear of the OLED panel 110, and the cover window 140 is disposed on the front of the OLED panel 110. The OLED panel 110 is coupled with the back cover 130 at the rear thereof and the cover window 140 at the front thereof.

Referring to FIG. 4, the OLED panel 110 includes a substrate 101 having a plurality of driving thin film transistors DTr's and a plurality of light emitting diodes E's thereon, and an encapsulation substrate 102 to encapsulate the substrate 101.

A semiconductor layer 104 is formed in a pixel region P, may be made of silicon, and includes an active region 104a as a channel at a center portion, and source and drain regions 104b and 104c located at both sides of the active region 104a and highly doped with impurities.

A gate insulating layer 105 is formed on the semiconductor layer 104.

A gate electrode 107 corresponding to the active region 104a and a gate line (not shown) extending along a direction are formed on the gate insulating layer 105.

A first inter-layered insulating layer 106a is formed entirely on the gate electrode 107 and the gate line. The first inter-layered insulating layer 106a and the gate insulating layer 105 include first and second semiconductor contact holes 109 exposing the source and drain regions 104b and 104c.

Source and drain electrodes 108a and 108b spaced part from each other are formed on the first inter-layered insulating layer 106a and contact the source and drain regions 104b and 104c through the first and second semiconductor contact holes 109.

A second inter-layered insulating layer 106b is formed on the source and drain electrodes 108a and 108b and the first inter-layered insulating layer 106a, and includes a drain contact hole 112 exposing the drain electrode 108b.

The source and drain electrodes 108a and 108b, the semiconductor layer 104, and the gate insulating layer 105 and the gate electrode on the semiconductor layer 104 form the driving thin film transistor DTr.

Even though not shown in the drawings, a data line crossing the gate line to define a pixel region P is formed on the substrate 101. A switching thin film transistor connected to each corresponding driving thin film transistor DTr is formed on the substrate 101, and may have substantially the same structure as the driving thin film transistor DTr.

In this embodiment, the switching thin film transistor and the driving thin film transistor DTr having a coplanar structure using the semiconductor layer 104 of poly silicon are described. Alternatively, these transistors may have another structure, for example, a bottom gate structure using intrinsic and extrinsic amorphous silicons.

A first electrode 111 as a component of the light emitting diode E is formed on the second inter-layered insulating layer 106b in each pixel region P and connected to the drain electrode 108b through the drain contact hole 112. The first electrode 111 may be an anode and be made of a material having a relatively high work function.

A bank 119 is formed between the first electrodes 111 of neighboring pixel regions P.

In other words, the first electrodes 111 of the pixel regions P are separated from each other with the bank 119 as a boundary of each pixel region P. Each of a plurality of pixel regions P's includes the driving thin film transistor(s) DTr, the switching thin film transistor(s) and the light emitting diode(s) E, all operatively coupled with the data and/or gate line(s).

An organic light emitting layer 113 is formed on the first electrode 111.

The organic light emitting layer 113 may have a single-layered structure using a light emitting material, or may have a multi-layered structure, which includes a hole injection layer, a hole transport layer, an emitting material layer, an electron transport layer, and an electron injection layer, in order to increase light emission efficiency.

The organic light emitting layers 113 may emit red (R), green (G) and blue (B) lights in respective pixel regions P. For example, the organic light emitting layers 113 may include red, green and blue light emitting layers 113a, 113b and 113c emitting red, green and blue lights in the pixel regions P, respectively.

A second electrode 115 is formed on the organic light emitting layer 113 and may be a cathode.

The second electrode 115 may have a double-layered structure including a relatively thin-deposited semi-transparent metal layer having a relatively low work function. In this case, the second electrode 115 may include a relatively thick-deposited transparent conductive material layer on the semi-transparent metal layer.

Accordingly, light emitted from the organic light emitting layer 113 travels through the second electrode 115 so that the OLED panel 110 is operated in a top emission type.

Alternatively, the second electrode 115 is made of opaque metal material, and thus light emitted from the organic light emitting layer 113 travels through the first electrode 111 so that the OLED panel 110 is operated in a bottom emission type.

In the OLED panel 110, voltages are applied to the first and second electrodes 111 and 115 according to a data signal, a hole injected from the first electrode 111 and an electron from the second electrode 115 are transported to the organic light emitting layer 113 to form an exciton, and when the exciton transits from an excited state to a ground state, light is produced and emitted.

The emitted light passes through the first electrode 111 or second electrode 115 to the outside so that the OLED panel 110 displays an image.

The encapsulating substrate 102 is disposed over the driving thin film transistor DTr and the light emitting diode E, and the substrate 101 and the encapsulation substrate 102 may be coupled with each other using an adhesive film 103.

Accordingly, the OLED panel 110 is encapsulated.

The adhesive film 103 functions to prevent an external moisture from penetrating into the light emitting diode E and protect the driving thin film transistor DTr and the light emitting diode E. The adhesive film 103 may cover up the light emitting diode E and be formed on the substrate 101.

The adhesive film 103 may be made of one of an OCA (optical cleared adhesive) material, a thermosetting resin and a thermosetting sealant to seal the driving thin film transistor DTr and the light emitting diode E.

The substrate 101 and the encapsulation substrate 102 may be made of glass, plastic material, stainless steel, metal foil or the like.

When the substrate 101 and the encapsulation substrate 102 are made of metal foil, the substrate 101 and the encapsulation substrate 102 may have a thickness of about Sum to about 100 um less than a thickness of the substrate 101 and the encapsulation substrate 102 made of glass or formed in a rolling method, and thus the overall thickness of the OLED panel 110 can be reduced.

Further, even though the OLED panel OLED is reduced, a durability of the OLED panel 110 can be improved.

The printed circuit board 118 is connected to the edge portion of the OLED panel 110 through a connection member 116 such as a flexible printed circuit film or TCP (tape carrier package) film.

A heat of high temperature is produced from driving circuit elements (e.g., 118a of FIG. 6A) mounted on the printed circuit board 118 when operating the OLED panel. Since such the heat may cause deterioration and damage of the driving circuit elements (118a of FIG. 6A), this heat is required to be rapidly radiated to the outside.

To do this, a heat dissipating pad may be located on the printed circuit board 118 to conduct a heat to the back cover 130 made of a metal material and release the heat to the outside.

Figure 6A:
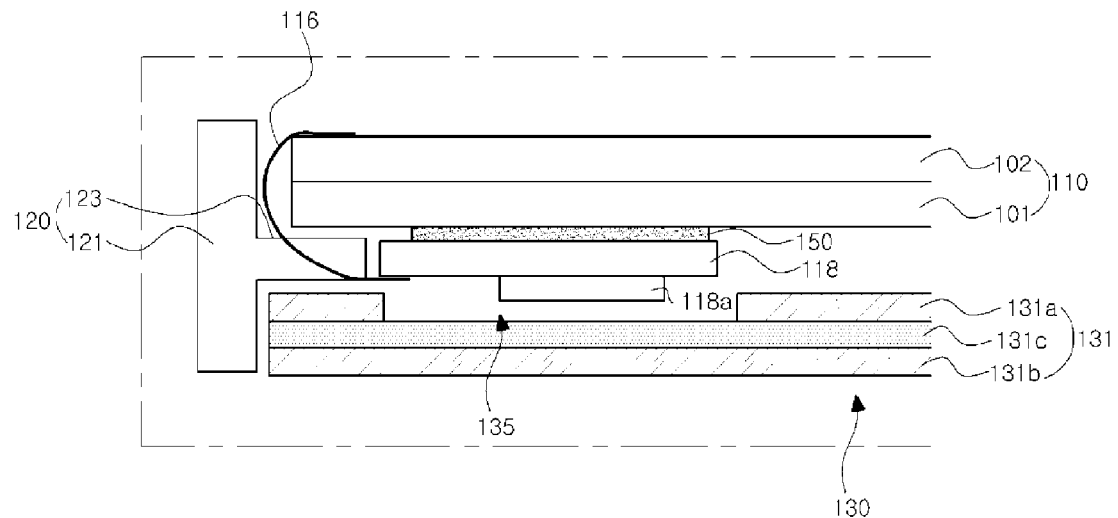
FIG. 6A is a schematic cross-sectional view illustrating a portion of the OLED according to the embodiment of the present invention.

The OLED panel 110 is supplied with driving signals from the driving circuit elements (118a of FIG. 6A).

The OLED panel 110 is assembled with the cabinet 120, the back cover 130 and the cover window 140 and thus is finally modulized, and the cabinet 120 may have a rectangular frame shape surrounding the edge portions of the OLED panel 110.

The cabinet 120 includes a vertical portion 121 surrounding the edges portion of the OLED panel 110, and a horizontal portion 123 extending inward the vertical portion 121 and supporting rear surfaces of the edge portions of the OLED panel 110.

The cabinet 120 is placed on the back cover 130. The back cover 130 has a shape to cover a rear surface and side surfaces, and includes a horizontal surface 131, and an edge portion 133 vertically bent from edges of the horizontal surface 131. The front of the back cover 130 is open so that an image displayed by the OLED panel 110 is viewed in front of the OLED panel 110.

The cover window 140 is coupled with the OLED panel 110 at the front of the OLED panel 110. The window cover 140 may be attached to the OLED panel 110 using a double-sided adhesive film.

The cover window 140 functions to protect the OLED panel 110 from an external impact, and transmit light from the OLED panel 110.

The cover window 140 may be made of a material having shock resistance and light transmission, for example, plastic material such as acrylic, or glass.

Accordingly, the OLED panel 110 surrounded by the cabinet 120 is coupled with the cover window 140 on the front thereof and the back cover 130 on the rear thereof.

The cabinet 120 may be referred to as a guide panel, support main, or mold frame, and the back cover 130 may be referred to as a cover bottom, bottom cover, or rear cover.

In this embodiment, the printed circuit board 118 connected to the OLED panel 110 is located on the rear surface of the OLED panel 110 by bending the connection member 116 and is adhered onto the rear surface of the OLED panel 110 through an adhesive member 150.

Further, a pocket groove 135 is formed in the horizontal surface 131 of the back cover 130 and corresponds to the printed circuit board 118 adhered to the OLED panel 110.

Figure 1:
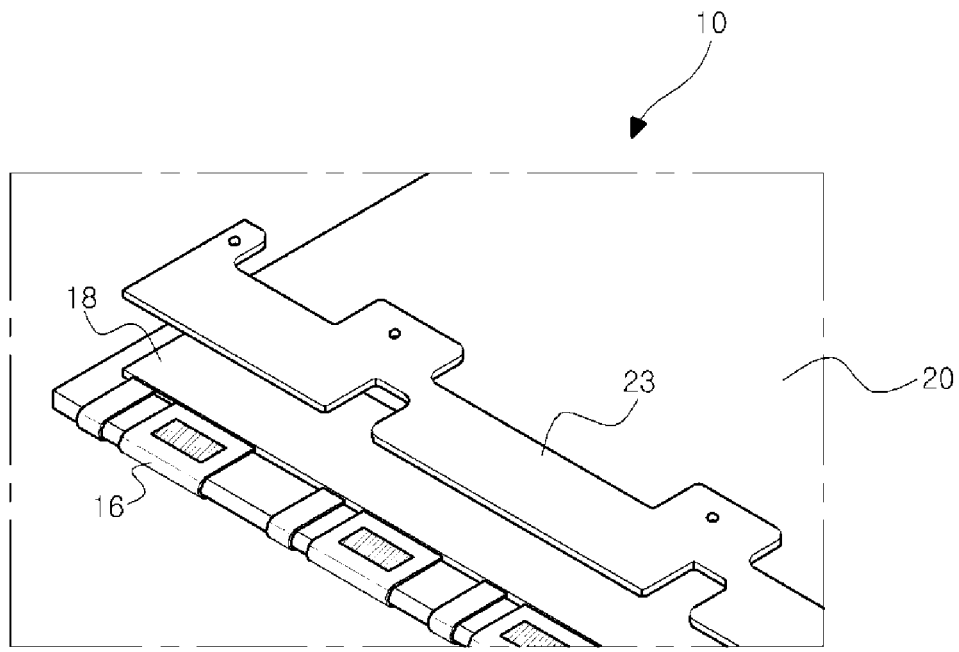
FIG. 1 is a schematic perspective view illustrating a portion of a rear surface of an OLED according to the related art.
Figure 2A:
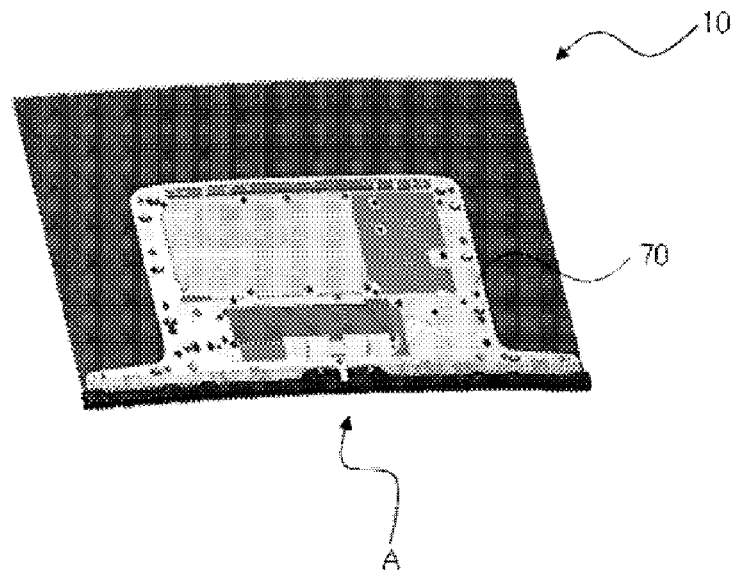
FIGS. 2A and 2B are schematic perspective views illustrating a rear surface of the OLED, on which a system board is mounted, according to the related art.
Figure 2B:
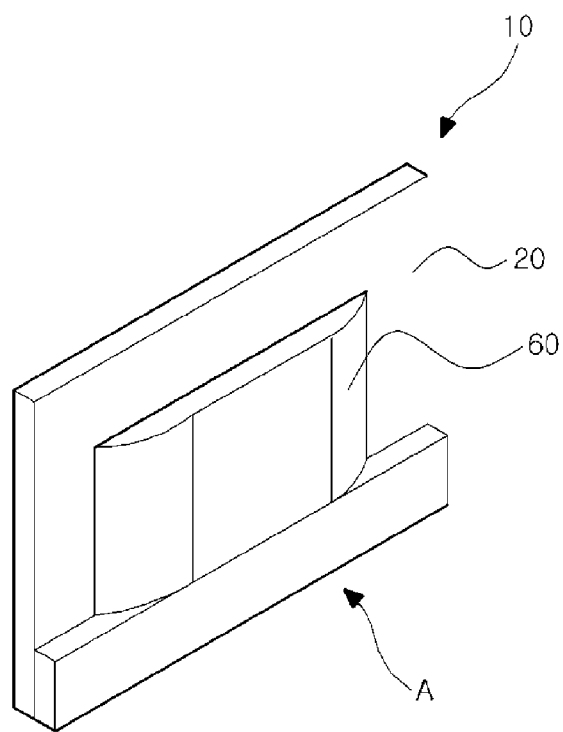

According to this configuration, the OLED 100 does not require an additional cover shield (23 of FIG. 1) of the related art protecting the printed circuit board 118, thus production cost and production time of the OLED 100 can be reduced, and thus production efficiency can be improved.

Further, since a shape of the rear surface of the OLED 100 can become simple, an available area of the rear surface of the OLED 100 can become large. Further, the OLED 100 can be advantageous in space applicability, interior decoration and design.

Further, even though the overall thickness of the OLED 100 does not increase, the printed circuit board 118 can be adhered onto the rear surface of the OLED panel 110 without electrical interference or interference by contact. Further, the thickness and weight of the OLED 100 can be reduced, and thus the OLED 100 having lightweight and thin profile can be provided, which is advantageous.

Figure 5:
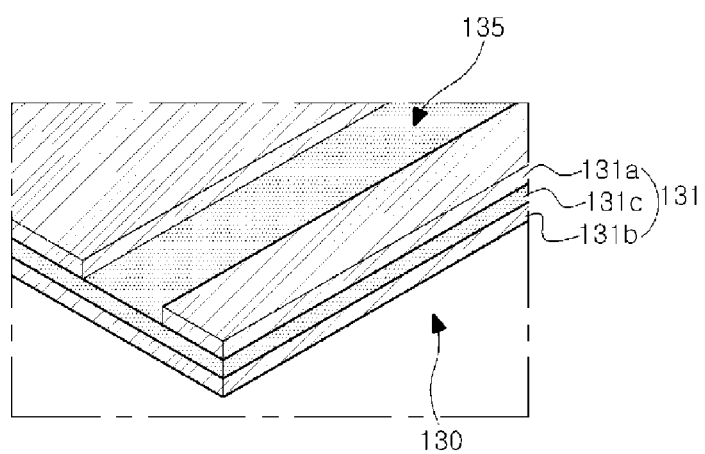
FIG. 5 is a schematic perspective view illustrating a portion of a horizontal surface of a back cover of the OLED according to the embodiment.

FIG. 5 is a schematic perspective view illustrating a portion of a horizontal surface of a back cover of the OLED according to an embodiment of the present invention.

Referring to FIG. 5, the back cover 130 includes the horizontal surface 131 and four edge portions (133 of FIG. 3) bent vertically from the edges of the horizontal surface 131. The horizontal surface 131 and the edge portions (133 of FIG. 3) may have a triple-layered structure that includes first and second metal layers 131a and 131b and an inorganic substance layer 131c.

The first and second metal layers 131a and 131b function to dissipate heat of high temperature produced from the OLED 100.

In other words, when the OLED panel 110 is operated, a temperature of the OLED panel 110 can rise up to about 80~90 degrees Celsius by a heat produced together with deterioration of the driving thin film transistor DTr. By such high-temperature heat, a lifetime of the OLED 100 may be sharply reduced.

Accordingly, a heat dissipation design of the OLED 100 is desired, and in this embodiment, the first and second metal layers 131a and 131b are formed of a material having a high thermal conductivity, and thus the high-temperature heat produced from the OLED panel 110 can be effectively dissipated to the outside.

Particularly, the back cover 130 has the first and second metal layers 131a and 131b formed as an inner-side surface and an outer-side surface, respectively. Accordingly, the first metal layer 131a dissipates a high-temperature heat produced from the OLED panel 110, the second metal layer 131b dissipates a high-temperature heat produced from the system board (e.g., 170 of FIG. 7A) that is mounted on the rear surface of the back cover 130, and thus the high-temperature heat produced in the OLED 100 can be effectively released rapidly to the outside.

The first and second metal layers 131a and 131b may be made of one, having a high thermal conductivity, selected from a group consisting aluminum (Al), copper (Cu), zinc (Zn), silver (Ag), gold (Au), iron (Fe), and alloy thereof. Among these materials, aluminum of high thermal conductivity, lightweight and low cost may be preferred.

When the first and second metal layers 131a and 131b are made of aluminum, the purity of aluminum may be about 99.5%, and anodizing treatment may be performed to form an anodized film in black color at a surface of the first and second metal layers 131a and 131b. In this case, a thermal absorptance of the first and second metal layers 131a and 131b can further increase.

Alternatively, the first and second metal layers 131a and 131b may be made of EGI (electrolytic galvanized iron).

The inorganic substance layer 131c functions to adhere the first metal layer 131a to the second metal layer 131b. The inorganic substance layer 131c may be made of silicone resin having adhesive property, such as silicon oxide ($SiO_2$) or silicon nitride (SiNx).

The inorganic substance layer 131c has a property of thermal insulation between the first and second metal layers 131a and 131b. In other words, the inorganic substance layer 131c functions such that the high-temperature heat produced from the OLED panel 110 and transferred to the first metal layer 131a is not conducted to the second metal layer 131b, and the high-temperature heat produced from the system board (e.g., 170 of FIG. 7A) and transferred to the second metal layer 131a is not conducted to the first metal layer 131a.

Accordingly, the high-temperature heat from the OLED panel 110 and the high-temperature heat from the system board are prevented from being united and producing a higher-temperature heat in the OLED 100. Particularly, reduction in the lifetime of the OLED panel 110 or abnormal display quality of the OLED panel 110 by a high-temperature from the system board (170 of FIG. 7A) being transferred to the OLED panel 110 can be prevented from happening.

Further, because of the inorganic substance layer 131c, the back cover 130 can improve rigidity and be formed at low cost.

In other words, the back cover 130 can have an excellent heat dissipation due to a high thermal conductivity, and also have an excellent rigidity and be formed at low cost.

The pocket groove 135 is formed corresponding to a length and a width of the printed circuit board 118. For example, it is preferred, but not limited, that the pocket groove 135 is 1.2 times the length and the width of the printed circuit board 118 so that the printed circuit board 118 is located in the pocket groove 135.

Particularly, the pocket groove 135 may be formed by removing a portion of the first metal layer 131a, and alternatively, may be formed removing the portion of the first metal layer 131a and a part of the inorganic substance layer 131c.

By this configuration, the printed circuit board 118 is adjacent to and faces the inorganic substance layer 131c, and thus an electrical interference of the driving circuit elements (118a of FIG. 6A) mounted on the printed circuit board 118 does not happen.

Further, since the thickness of the OLED 100 is not increased or may be reduced, a thin-profiled OLED 100 can be provided.

Figure 6B:
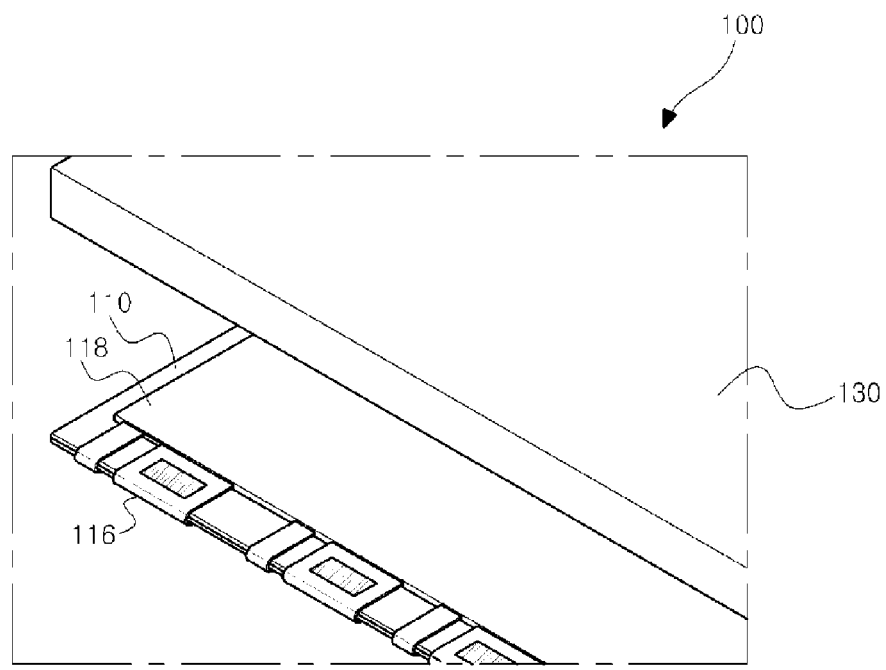
FIG. 6B is a schematic perspective view illustrating a portion of a rear surface of the OLED according to the embodiment of the present invention.
Figure 7A:
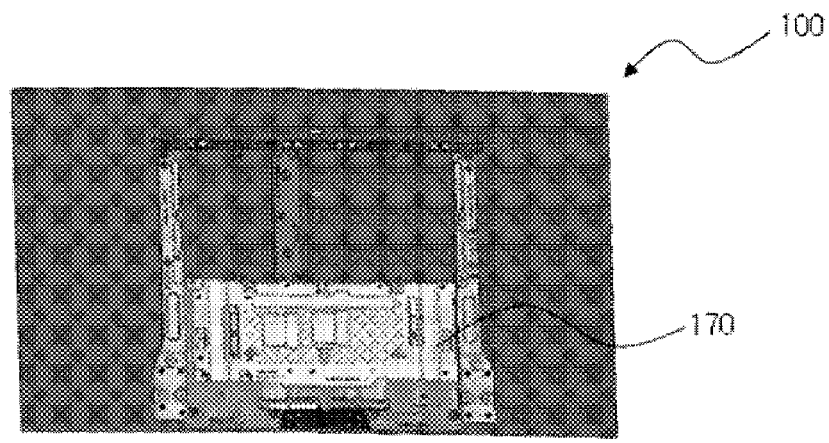
FIGS. 7A and 7B are schematic perspective views illustrating a rear surface of the OLED according to the embodiment of the present invention.
Figure 7B:
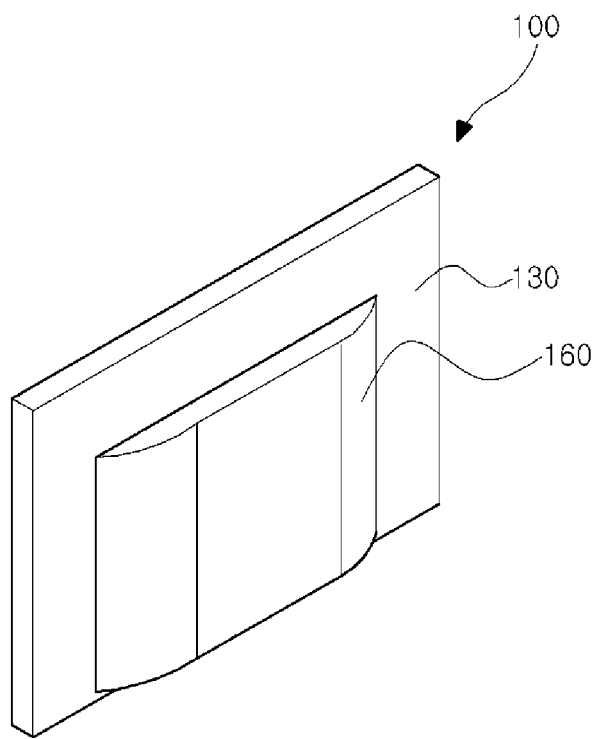

FIG. 6A is a schematic cross-sectional view illustrating a portion of the OLED according to an embodiment of the present invention, and FIG. 6B is a schematic perspective view illustrating a portion of a rear surface of the OLED according to an embodiment of the present invention. FIGS. 7A and 7B are schematic perspective views illustrating a rear surface of the OLED according to an embodiment of the present invention.

Referring to FIGS. 6A and 6B, the printed circuit board 118 swung to the rear surface through the connection member 116 and adhered onto the rear surface of the OLED panel 110 is located at an edge portion of the OLED panel 110, and an edge portion of the rear surface of the OLED panel 110 is placed on and supported by the horizontal portion 123 of the cabinet 120.

The printed circuit board 118 is attached onto the rear surface of the rear surface of the OLED panel 110 through an adhesive member 150. The adhesive member 150 may be a double-sided adhesive tape, or may use a rubber magnet when the substrate 101 is made of metal foil.

The printed circuit board 118 and the rubber magnet may be attached to each other using an double-sided adhesive tape. Further, in the case of using the rubber magnet, there is an advantage that when the printed circuit board 118 is defective or adhesion of the printed circuit board 118 is misaligned, the printed circuit board 118 is easily detached from the rear surface of the OLED panel 110 and it or another printed circuit board is re-attached onto the rear surface of the OLED panel 110.

The OLED panel 110 with the printed circuit board 118 coupled thereto is placed on and supported by the horizontal portion 123 of the cabinet 120 and surrounded by the vertical portion 121 of the cabinet 120, and then the OLED panel 110 in such the state may be assembled with the back cover 130.

Since the pocket groove 135 is formed in the horizontal surface 131 of the back cover 130 corresponding to the printed circuit board 118, even though an spacing between the printed circuit board 118 and the back cover 130 is not provided, an interference due to contact between the driving circuit elements 118a mounted on the printed circuit board 118 and the back cover 130 does not happen.

In other words, even though the thickness of the OLED 100 does not increase, the printed circuit board 118 connected to the edge portion of the OLED panel 110 can be swung to the rear surface of the OLED panel 110 and adhered onto the OLED panel 110 for modulization without interference due to contact between the printed circuit board 118 and the back cover 130.

Accordingly, the thin-profiled OLED 100 can be provided.

Further, the pocket groove 135 is formed by removing a portion of the first metal layer 131a, or removing the portion of the first metal layer 131a and a part of the inorganic substance layer 131c, the printed circuit board 118 is adjacent to and faces the inorganic substance layer 131c. Accordingly, an electrical interference of the driving circuit elements 118a mounted on the printed circuit board 118 does not happen.

In other words, when the driving circuit elements 118a are adjacent to a metal material, parasitic capacitances therebetween or electrical interference such as electrical short therebetween are produced. In this embodiment, the pocket groove 135 is formed such that the inorganic substance layer 131c is exposed by removing a portion of the first metal layer 131a corresponding to the printed circuit board 118, and thus the driving circuit elements 118a can be configured not to be adjacent to and face the metal material.

By this configuration, even though the printed circuit board 118 is adhered onto the rear surface of the OLED panel 110 and then the back cover 130 is located on the rear surface of the OLED panel 110, electrical interference of the driving circuit elements 118a can be prevented.

Further, in this embodiment, since the printed circuit board 118 is adhered onto the OLED panel 110, a shape of the rear surface of the back cover 130 can be simplified, and thus there is an advantage that an available area of the rear surface of the OLED 100 can be large.

In other words, referring to FIG. 7A, a system board 170 is mounted on the rear surface of the OLED 100, and on the system board 170, are mounted components, such as an A/D board (analog/digital board) which receives video or voice signal input from an external system and transfers the video or voice signal to the OLED panel 110 or a speaker to control display or voice output, an OSD (on screen display) board which controls function relating to screen adjustment, a speaker which outputs a voice signal, an adapter which supplies power for the OLED panel 110, and various cables.

Since the OLED 100 has the rear surface simplified, an area available to mount the system board 170 is large so that the system board 170 can be easily designed and mounted on the rear surface of the OLED 100 without limit of location and area of the system board 170.

Further referring to FIG. 7B, the rear surface of the OLED 100 coupled with a set frame 160 can be also simplified, and thus space applicability, interior decoration and design can be improved as required recently.

As described above, in the OLED 100 according to the embodiment, the printed circuit board 118 connected to the OLED panel 110 along an edge portion via a connection member 116 is swung to the rear surface of the OLED panel 110 and adhered onto the rear surface of the OLED panel 110, and the pocket groove 135 corresponding to the printed circuit board 118 is formed in the horizontal surface 131 of the back cover 130 having a triple-layered structure. Accordingly, since an additional cover shield (e.g., 23 of FIG. 1) of the related art is not needed, production cost and production time of the OLED 100 can be reduced and thus production efficiency can be improved.

Further, since the rear surface of the OLED 100 can be simplified, there an advantage that an available area of the rear surface of the OLED 100 can be large, and interior decoration and design can be improved.

Further, even though the thickness of the OLED 100 does not increase, the printed circuit board 118 is adhered onto the rear surface of the OLED panel 110 without electrical interference or interference by contact. Further, since increase of the thickness and weight of the OLED 100 due to the cover shield (e.g., 23 of FIG. 1) can be prevented, the OLED 100 having lightweight and thin profile can be provided.

It will be apparent to those skilled in the art that various modifications and variations can be made in a display device of the present invention without departing from the sprit or scope of the disclosure. Thus, it is intended that the present invention covers the modifications and variations of this disclosure provided they come within the scope of the appended claims and their equivalents.

What is claimed is:

1. An organic light emitting diode (OLED) comprising:
   an OLED panel;
   a printed circuit board adhered onto a rear surface of the OLED panel; and
   a back cover including first and second metal layers, an inorganic substance layer between the first and second metal layers, and a pocket groove,
   wherein the pocket groove is formed by removing a portion of the first metal layer corresponding to the printed circuit board, such that the printed circuit board is configured to face the inorganic substance layer.

2. The OLED of claim 1, wherein the printed circuit board is adhered onto the OLED panel through a double-sided adhesive tape or rubber magnet.

3. The OLED of claim 1, wherein the first and second metal layers are made of aluminum (Al), and the inorganic substance layer is made of silicone resin of adhesive property.

4. The OLED of claim 3, wherein the back cover has a triple-layered structure that includes the first and second metal layers and the inorganic substance layer, wherein the first and second metal layers form an inner-side surface and an outer-side surface, respectively.

5. The OLED of claim 1, wherein the pocket groove is about 1.2 times length and width of the printed circuit board.

6. The OLED of claim 1, wherein the printed circuit board is connected to the OLED panel through a flexible printed circuit board or tape carrier package (TCP) film.

7. The OLED of claim 1, further comprising:
   a cover window on a front of the OLED panel; and
   a cabinet surrounding and supporting edge portions of the OLED panel.

8. The OLED of claim 1, wherein driving circuit elements on the printed circuit board are configured to face the inorganic substance layer corresponding to the pocket groove.

9. An organic light emitting diode (OLED) comprising:
   an OLED panel;
   a printed circuit board adhered onto a rear surface of the OLED panel;
   a back cover including first and second metal layers, an inorganic substance layer between the first and second metal layers, and a pocket groove;
   a cover window on a front of the OLED panel; and
   a cabinet surrounding and supporting edge portions of the OLED panel,
   wherein the pocket groove includes a removed portion of the first metal layer corresponding to the printed circuit board, such that driving circuit elements mounted on the printed circuit board face the inorganic substance layer.

10. The OLED of claim 9, wherein the printed circuit board is adhered onto the OLED panel through a double-sided adhesive tape or rubber magnet.

11. The OLED of claim 9, wherein the first and second metal layers includes aluminum (Al), and the inorganic substance layer includes silicone resin of adhesive property.

12. The OLED of claim 9, wherein the back cover has a triple-layered structure that includes the first and second metal layers and the inorganic substance layer, and
   wherein the first and second metal layers form an inner-side surface and an outer-side surface, respectively.

13. The OLED of claim 9, wherein the pocket groove is about 1.2 times a length and a width of the printed circuit board.

14. The OLED of claim 9, wherein the printed circuit board is connected to the OLED panel through a flexible printed circuit board or tape carrier package (TCP) film.

* * * * *